(12) United States Patent
Cha et al.

(10) Patent No.: US 7,684,242 B2
(45) Date of Patent: Mar. 23, 2010

(54) FLASH MEMORY DEVICE AND METHOD OF OPERATING THE SAME

(75) Inventors: Jae Won Cha, Seoul (KR); Sam Kyu Won, Yongin-si (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/962,054

(22) Filed: Dec. 20, 2007

(65) Prior Publication Data

US 2009/0040826 A1    Feb. 12, 2009

(30) Foreign Application Priority Data

Aug. 8, 2007    (KR) ...................... 10-2007-0079480

(51) Int. Cl.
*G11C 16/06* (2006.01)
(52) U.S. Cl. ............................ 365/185.09; 365/189.05; 365/189.07; 365/230.06
(58) Field of Classification Search ............ 365/185.09, 365/189.05, 189.07, 230.06
See application file for complete search history.

(56) References Cited

U.S. PATENT DOCUMENTS 6,751,122 B2 *  6/2004  Kawai et al. ........... 365/185.09
6,898,119 B2 *  5/2005  Imamiya et al. ........ 365/185.09
7,061,799 B2 *  6/2006  Kawai et al. ........... 365/185.09
7,254,060 B2 *  8/2007  Kawai et al. ........... 365/185.09
7,486,559 B2 *  2/2009  Morooka et al. ....... 365/185.17

FOREIGN PATENT DOCUMENTS

KR    1020050059984 A    6/2005

* cited by examiner

*Primary Examiner*—Viet Q Nguyen
(74) *Attorney, Agent, or Firm*—Townsend and Townsend and Crew LLP

(57) ABSTRACT

A flash memory device is disclosed. The flash memory device includes a memory cell array configured to have memory cells for storing data, and store initial data in a part of the memory cells, a page buffer circuit configured to have page buffers for providing data to be programmed in the memory cell or reading data from the memory cell, a controller configured to control the page buffer circuit so that the initial data stored in the memory cell array are read when operation of the flash memory device is started, discriminate error of the read initial data, and amend the error of the initial data, and an initial data latching circuit for latching the initial data of which the error is amended by the controller.

10 Claims, 4 Drawing Sheets

FIG. 5

| D0 | D1 | D2 | D3 | D4 | D5 | D6 | D7 |
|----|----|----|----|----|----|----|----|
| 1  | 1  | 0  | 1  | 1  | 1  | 1  | 0  |
| 0  | 1  | 0  | 1  | 1  | 1  | 1  | 1  |
| 1  | 1  | 0  | 0  | 1  | 1  | 1  | 1  |
| 1  | 1  | 0  | 0  | 0  | 0  | 0  | 0  |

FLASH MEMORY DEVICE AND METHOD OF OPERATING THE SAME

CROSS-REFERENCE TO RELATED APPLICATIONS

This application claims priority from Korean Patent Application No. 2007-79480 filed on Aug. 8, 2007, the contents of which are incorporated herein by reference in its entirety.

BACKGROUND OF THE INVENTION

The present invention relates to a flash memory device and more particularly to a method for storing data used in an initial power up.

As the demand for mobile devices such as a camcorder, a digital camera, a portable phone, an MP3 (MPEG-1 Layer 3) player, etc. increases, efforts also increase to enhance the flash memory device.

A NAND flash memory device employed in the mobile device operates in accordance with an application program, wherein option of the NAND flash memory device is determined in accordance with the operation characteristics of the mobile device.

The applications requiring the mobile device has increased accordingly as new techniques are developed. Hence, a method for providing flexible options to the NAND flash memory device has been required.

FIG. 1 is a block diagram illustrating a conventional flash memory device.

In FIG. 1, the flash memory device 100 includes a memory cell array 110 having memory cells for storing data, a surrounding circuit 120 for storing data in the memory cell array 110 or reading data from the memory cell array 110, a controller 130 for controlling operation of the flash memory device 100 by controlling the surrounding circuit 120, an initial data latching circuit 140 for temporarily storing administrative information required for operation of the flash memory device 100 in an initial operation (i.e., power up) of the flash memory device 100, and a fuse circuit 150 for storing initial administrative information to be stored in the initial data latching circuit 140 using sub-fuse circuits.

The memory cell array 110 includes the memory cells.

The surrounding circuit 120 is connected to the memory cell array 110 and includes a page buffer for programming data in the memory cells or reading data from the memory cells.

The controller 130 outputs a control signal for controlling operation of the surrounding circuit 120.

The fuse circuit 150 has a plurality of sub-fuse circuits for storing data, and generates administrative information for controlling operation of the flash memory device 100 by combining information stored in the sub-fuse circuits. Here, the administrative information includes voltage setting information, etc. for operating optimally the flash memory device 100 in accordance with a system used in the flash memory device 100. The administrative information is stored in the initial data latching circuit 140 when the flash memory device 100 is operated at the initial power up so that the controller 130 uses the administrative information.

However, the sub-fuse circuits occupy much space compared to a transistor, thereby affecting the size of a memory chip which has become highly integrated. In addition, if the sub-fuse circuit is cut, the sub-fuse circuit may not be connected again. As a result, yield may be lowered due to a cutting error.

SUMMARY OF THE INVENTION

It is a feature of the present invention to provide a flash memory device and a method of operating the same for reducing space which a sub-fuse circuit occupies, storing administrative information in a memory cell array and using the administrative information.

A flash memory device according to one example embodiment of the present invention includes a memory cell array configured to have memory cells for storing data, and store initial data in a part of the memory cells; a page buffer circuit configured to have page buffers for providing data to be programmed in the memory cell or reading data from the memory cell; a controller configured to control the page buffer circuit so that the initial data stored in the memory cell array are read when operation of the flash memory device is started, discriminate error of the read initial data, and amend the error of the initial data; and an initial data latching circuit configured to latch the initial data of which the error is amended by the controller.

The flash memory device further includes an X decoder configured to select a word line of the memory cell array in accordance with an address inputted through an input/output controller; and an Y decoder coupled to the page buffers, configured to transmit data to be programmed to the page buffer by coupled to a data input/output line, or output read data transmitted from the page buffer to the data input/output line.

The controller includes a data evaluating circuit configured to discriminate whether or not error is occurred to the initial data read by the page buffer circuit, and transmit data to which error is not occurred to the initial data latching circuit; and a storing means configured to store address information of the memory cell array in which the initial data are stored.

The memory cell array has an initial data storing circuit for storing the initial data in accordance with an address set by the controller.

The initial data storing circuit includes a first data means configured to store the initial data to be stored in the initial data latching circuit; and a second data means configured to store data having logic level opposed to the data in the first data means.

The data evaluating circuit includes a control signal outputting means configured to compare the data of the first data means with the data of the second data means and output a control signal in accordance with the comparing result; and a data transmitting circuit configured to transmit the data of the first data means to the initial data latching circuit in accordance with the outputted control signal.

The control signal outputting means is a logic combination device for performing logic combination of the data of the first data means and the data of the second data means, and outputting result of the logic combination.

The control signal outputting circuit outputs the control signal for controlling the data transmitting circuit so that first data are transmitted to the initial data latching circuit in case that the data of the second data means has logic level opposed to the data of the first data means.

The initial data storing circuit includes a third data means configured to store the initial data stored in the initial data latching circuit; and a fourth data means configured to store error verifying data for controlling error of the initial data stored in the third data means.

The fourth data means stores the error verifying data, wherein logic level of the error verifying data in case that number of '1' data in the third data means is even number is different from that of the error verifying data in case that number of '1' data in the third data means is odd number.

The data evaluating circuit controls the page buffer circuit so that the initial data are again read in case that error is occurred to the read data.

A method of operating a flash memory device according to one example embodiment of the present invention includes performing a power on reset operation in accordance with input of a power; reading initial data in accordance with address information of a predetermined memory cell; and storing temporarily the read initial data, and controlling operation of the flash memory device in accordance with the stored initial data.

The method further includes discriminating whether or not error is occurred to the read initial data; and amending the error of the initial data in case that it is discriminated that the error is occurred to the read initial data.

The step of amending the error includes reading again data of the memory cell for storing data to which error is occurred.

The method further includes changing the initial data by storing data outputted from an outside device in accordance with address information related to the initial data.

As described above, embodiments of the present invention relate to storing administrative information in a memory cell array, thereby reducing space occupied by a sub-fuse circuit.

BRIEF DESCRIPTION OF THE DRAWINGS

FIG. 5 is a view illustrating storage of the initial data according to a second example embodiment of the present invention.

DESCRIPTION OF SPECIFIC EMBODIMENTS

Hereinafter, the embodiments of the present invention will be explained in more detail with reference to the accompanying drawings.

Figure 1:
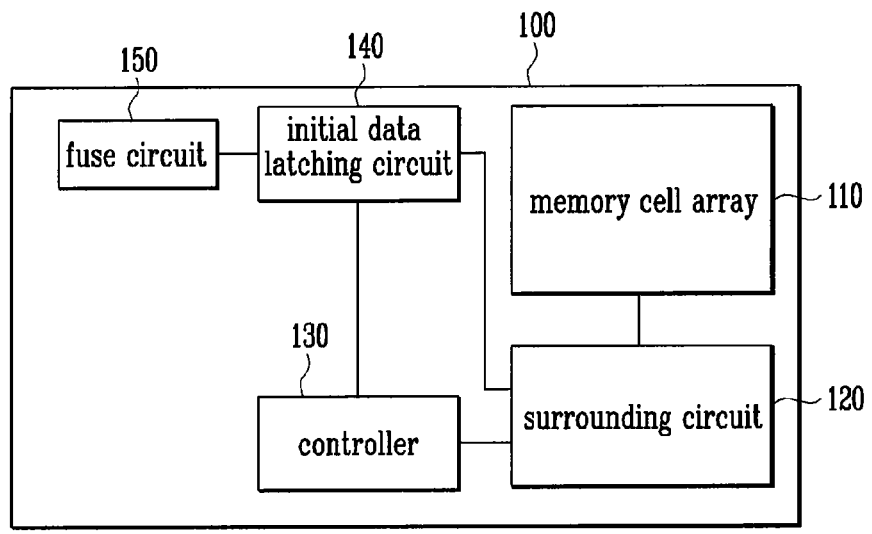
FIG. 1 is a block diagram illustrating a conventional flash memory device.
Figure 2:
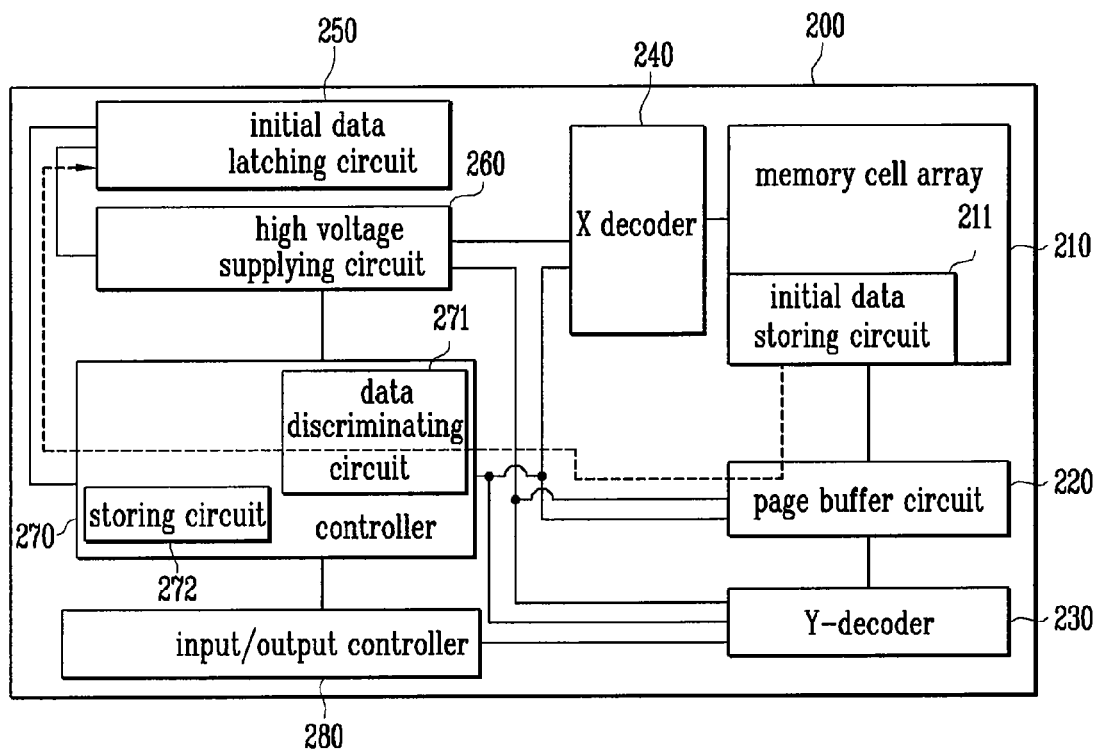
FIG. 2 is a block diagram illustrating a flash memory device according to one example embodiment of the present invention.

FIG. 2 is a block diagram illustrating a flash memory device according to one example embodiment of the present invention.

In FIG. 2, the flash memory device 200 of the present embodiment includes a memory cell array 210 having memory cells coupled to bit lines BL and word lines WL, a page buffer circuit 220 having page buffers coupled to a pair of bit lines and for latching and providing data to be programmed in the memory cell and reading data in the memory cell and providing the read data, a Y decoder 230 for providing data input/output path of the page buffer circuit 220 in accordance with inputted address, an X decoder 240 for selecting a word line in accordance with the address, an initial data latching circuit 250 for latching administrative information needed for initial operation of the flash memory device 200, a high voltage supplying circuit 260 for providing a voltage required for operation of the flash memory device 200, a controller 270 for controlling operation of the flash memory device 200, and an input/output controller 280 coupled to the Y decoder 230 and the controller 270 and for controlling input/output of data.

The memory cell array 210 has the memory cells coupled to the bit lines and the word lines, and an initial data storing circuit 211 using memory cells corresponding to addresses assigned by the controller 270.

The memory cells of the initial data storing circuit 211 store administrative information for initial operation of the flash memory device 200, and stores data through various methods to control errors in the stored initial data.

The page buffer circuit 220 has the page buffers coupled to a pair of bit lines.

The page buffers have latch circuits for temporarily storing data to be programmed to a memory cell and providing the stored data, and for temporarily storing data read from a memory cell.

The page buffers read data from the memory cell, and provide the read data to an outside device (not shown) through an input/output path provided by the Y decoder 230 and the input/output controller 280. In addition, the page buffers transmit read data to the controller 270 when data related to initialization are read.

The Y decoder 230 provides a path between the page buffers of the page buffer circuit 220 and the input/output controller 280 in accordance with an input address.

The X decoder 240 selects a word line of the memory cell array 210 in accordance with the input address.

The initial data latching circuit 250 receives the initial data read from the initial data storing circuit 211 through the controller 270, and temporarily stores the received data.

The high voltage supplying circuit 260 generates a voltage for a program operation or a read operation in accordance with the controller 270, and outputs the generated voltage.

The controller 270 has a data evaluating circuit 271 for controlling operation of the flash memory device 200, determining whether or not an error has occurred to the initial data provided from the page buffer circuit 220, and transmitting initial data (to which error has not occurred) to the initial data latching circuit 250. Additionally, the controller 270 has a storing circuit 272 for storing an algorithm for controlling operation of the flash memory device 200. The storing circuit contains the address of the memory cells in the memory cell array 210 which store the initial data.

The data evaluating circuit 271 detects an error in accordance with the initial data stored in the initial data storing circuit 211, and transmits only data to which an error has not occurred to the initial data latching circuit 250. Here, determination of an error occurrence is different in accordance with the data stored in the initial data storing circuit 211.

The data are stored in the initial data storing circuit 211 so that an error occurring when the data are read is easily detected and amended.

An operation of latching the initial data stored in the initial data storing circuit 211 to the initial data latching circuit 250 when the flash memory device 200 operates at the initial time after power on will be described in detail.

Figure 3A:
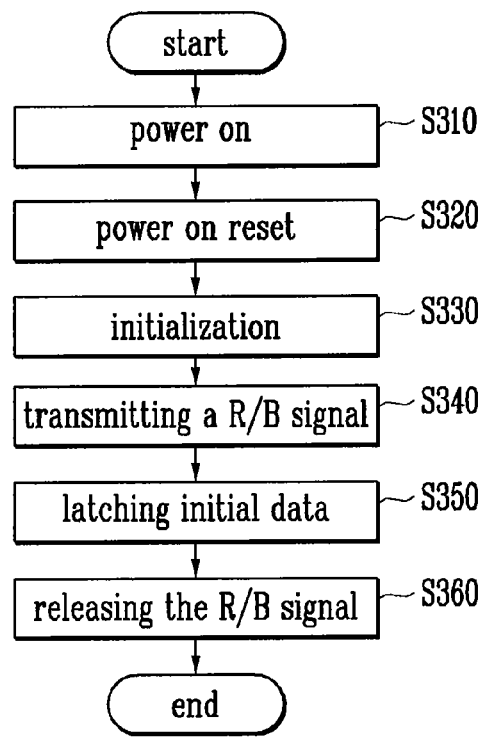
FIG. 3A is a flow chart illustrating operation of the flash memory device according to one example embodiment of the present invention.

FIG. 3A is a flow chart illustrating operation of the flash memory device according to one embodiment of the present invention.

In FIG. 3A, if a power is turned on for initial operation of the flash memory device 200 in step S310, a power on reset signal is transmitted in step S320.

In step S330, each of function blocks in the flash memory device 200 performs an initial operation in accordance with the transmitted power on reset signal. Here, the initial operation is controlled by the controller 270, and sets the condition of the circuits to predetermined conditions. That is, the initial operation means (or unit) a minimal setting for normal operation of the flash memory device 200.

In the case that the initialization is finished, the controller 270 latches initial data as administrative information for controlling to operate normally the flash memory device 200 to the initial data latching circuit 250. To perform the above process, the controller 270 transmits a read busy R/B signal in step S340.

In step S350, the controller 270 controls the page buffer circuit 220 so that the initial data stored in the initial data storing circuit 211 are read under the condition that the R/B signal is transmitted, amends the error of the read data, and latches the amended initial data to the initial data latching circuit 250. To perform the above process, the controller 270 should know in advance the address of the initial data storing circuit 211 in which the initial data are stored.

In step S360, in the case that the initial data are latched in the initial data latching circuit 250, the controller 270 releases the R/B signal so that other operations may be performed.

Hereinafter, the step S350 will be described in detail.

Figure 3B:
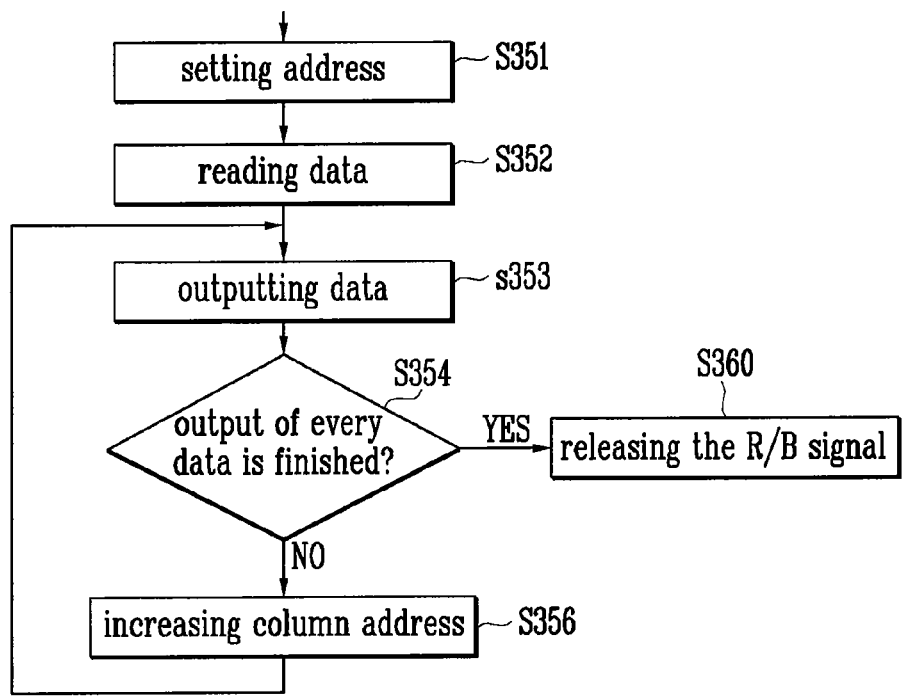
FIG. 3B is a flow chart illustrating a process of latching the initial data in FIG. 3A.

FIG. 3B is a flow chart illustrating a process of latching the initial data in FIG. 3A.

In FIG. 3B, once the R/B signal is transmitted in step S340, the controller 270 sets the address of the initial data storing circuit 211 in step S351.

In step S352, the page buffer circuit 220 reads the data.

Address information of the initial data storing circuit 211 is stored in the storing circuit 272 of the controller 270.

In step S353, the X decoder 240 selects a word line of the initial data storing circuit 211 in accordance with the set of the address, and the page buffer circuit 220 reads data by selecting a column address. Then, the page buffer circuit 220 outputs the read data to the controller 270.

The controller 270 verifies errors in the initial data transmitted from the page buffer circuit 220, and transmits the initial data (to which an error has not occurred) to the initial data latching circuit 250.

The initial data latching circuit 250 latches and stores the initial data transmitted from the data evaluating circuit 271 of the controller 270.

In steps S354 and S356, the process of reading the initial data are repeated with increasing column address related to the address set to the initial data storing circuit 211.

In step S360, if the read of the initial data related to every address is finished, the R/B signal is released.

A method of detecting an error in the initial data and amending the error varies in accordance with the initial data stored in the initial data storing circuit 211.

Figure 4A:
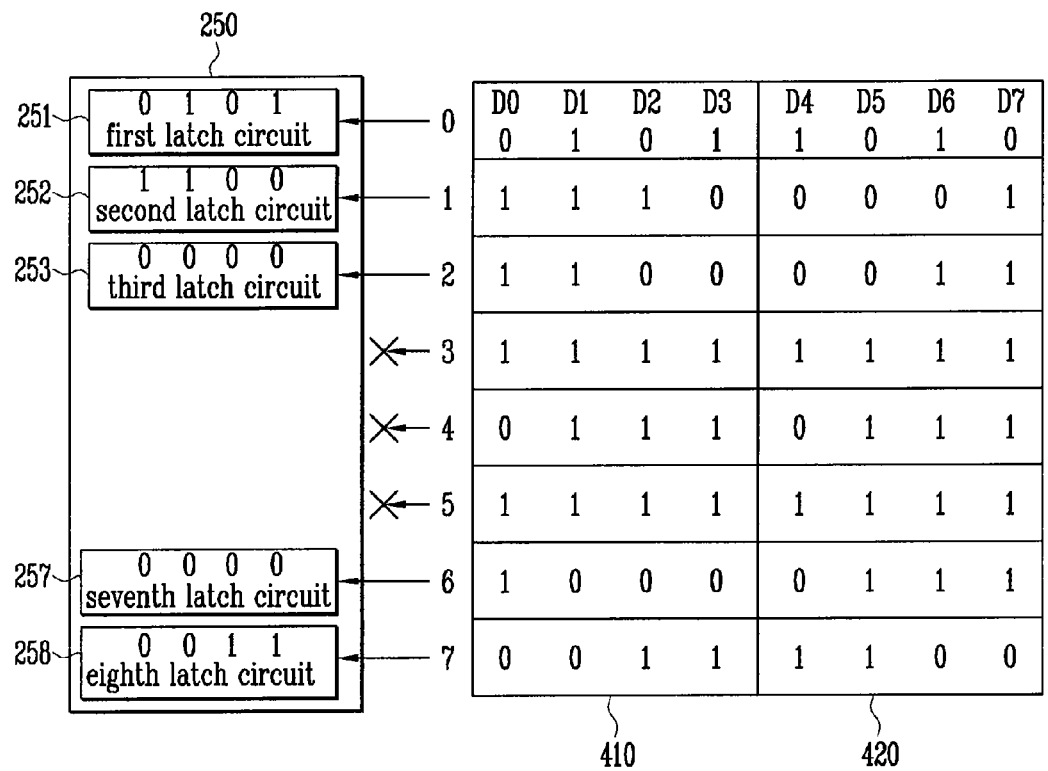
FIG. 4A is a view illustrating storage of the initial data according to a first example embodiment of the present invention.

FIG. 4A is a view illustrating storage of the initial data according to one embodiment of the present invention.

The initial data of the present embodiment are inverted before they are stored. That is, a first data group 410 and a second data group 420 (inverted) store data as shown in FIG. 4A.

For example, the initial data are stored in the first data group 410 as first data to fourth data D0 to D3. Inverted data of the first to fourth data D0 to D3 are stored in the second data group 420 as fifth data to eighth data D4 to D7.

The data of the first data group 410 and the second data group 420 are read, and then an error from the read data is verified. Then, the data are transmitted to the initial data latching circuit 250.

The initial data latching circuit 250 has a first latch circuit 251 to an eighth latch circuit 258. Here, the data outputted from the data evaluating circuit 271 are stored in sequence in the first latch circuit 251 to the eighth latch circuit 258.

First data shown in FIG. 4A are data stored in for example the first latch circuit 251 of the initial data latching circuit 250. Here, the first data group 410 has '0101', and the second data group 420 has '1010'.

The data evaluating circuit 271 compares the data read from the first data group 410 with the data read from the second data group 420. In the case that the logic level of the data read from the first data group 410 is an inverse of the data read from the second data group 420, it is determined that the data are normally read. However, in case that logic level of the data read from the first data group 410 is identical to that of the data read from the second data group 420, it is determined that an error has occurred in the read operation. In this case, the data are not transmitted to the initial data latching circuit 250.

In the case that it is determined that an error has occurred, the read operation is performed again.

Hereinafter, the data evaluating circuit 271 for verifying the error will be described.

Figure 4B:
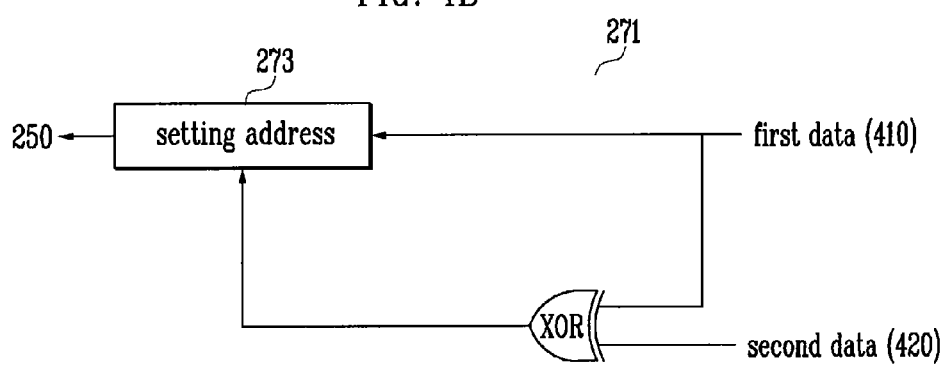
FIG. 4B is a view illustrating the data evaluating circuit for latching the data stored in FIG. 4A as the initial data.

FIG. 4B is a view illustrating the data evaluating circuit for latching the data stored in FIG. 4A as the initial data.

In FIG. 4B, in the case that the initial data are stored, the data evaluating circuit 271 a data transmitting circuit 273 for receiving the first data group 410 for detection of an error and outputting the received first data group 410 in accordance with a control signal, and an exclusive OR gate XOR for comparing the first data group 410 with the second data group 420 and outputting the control signal in accordance with the comparing result.

The data transmitting circuit 273 receives in sequence the initial data of the first data group 410, and transmits the received initial data to the initial data latching circuit 250 when the control signal having a high level is inputted.

The exclusive OR gate XOR is a logic gate for outputting a signal having a high level only when the received data have logic levels that are opposite to each other. Accordingly, the data transmitting circuit 273 transmits the received initial data to the initial data latching circuit 250 only when the data of the first data group 410 has a logic level opposite to the data of the second data group 420.

As described above, the data transmitting circuit 273 does not transmit the initial data to the initial data latching circuit 250 only when the data of the first data group 410 has the same logic level as the data of the second data group 420 accordingly as an error has occurred in the read operation. Additionally, the controller 270 determines that an error has occurred in the read operation, and controls the page buffer circuit 220 to reread the initial data.

Hereinafter, a method of storing the initial data, determining an error and amending the error (except the above method of discriminating the error by comparing the data of the first data group 410 with the data of the second data group 420) will be described.

FIG. 5 is a view illustrating storage of the initial data according to a second example embodiment of the present invention.

In FIG. 5, the method of storing the initial data verifies the error using one of first data D0 to eighth data D7. In other words, in case that number of '1' included in the data D0 to D6 is even number, the eighth data D7 is set to '0'. However, in case that number of '1' included in the data D0 to D6 is odd number, the eighth data D7 is set to '1'.

As shown in FIG. 5, since number of '1' included in the data D0 to D6 at a first line is even number as 6, the eighth data bit D7 has '0' data.

The data evaluating circuit 271 classifies the initial data outputted from the page buffer circuit 220 as shown in FIG. 5, and detects an error by comparing the eighth data bit D7 with number of '1' included in the data D0 to D6. Then, the initial data are reread if an error has occurred.

To change the initial data stored in the initial data storing circuit 211, data to be changed are inputted through the input/output controller 280. Then, the controller 270 performs a program operation of data by setting address of the initial data storing circuit 211, and so the initial data may be changed.

In one example embodiment of the present invention, the initial data storing circuit 211 may be included in an extra storing array and not the memory cell array 210.

In brief, since a part of the memory cell array 210 is assigned for storing the initial data, fuse circuits occupying much space are not needed. As a result, layout area of the flash memory device 200 may be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device comprising:
    a memory cell array having a plurality of memory cells for storing data, wherein a portion of the memory cells is configured to store initial data;
    a page buffer circuit having a plurality of page buffers configured to store data to be programmed in the memory cell or data to be read from the memory cell;
    a controller comprising a data evaluating circuit, wherein the controller is configured to:
        control the page buffer circuit so that the initial data stored in the memory cell array is read by the page buffer circuit when the flash memory device is powered up,
        determine, by the data evaluating circuit, whether the initial data read from the memory cell array by the page buffer circuit has an error,
        in the event that the data evaluating circuit determines that the initial data has an error, control the page buffer circuit so that the initial data is read again, and
        in the event that the data evaluating circuit determines that the initial data does not have an error, transmit the initial data; and
    an initial data latching circuit configured to receive and latch the initial data transmitted by the controller.

2. The flash memory device of claim 1, further comprising:
    an X decoder configured to select a word line of the memory cell array in accordance with an address inputted through an input/output controller; and
    an Y decoder coupled to the page buffers, the Y decoder being configured to transmit data to be programmed to the page buffer by connecting to a data input/output line, or output read data transmitted from the page buffer to the data input/output line.

3. The flash memory device of claim 2, wherein the controller includes:
    a storing unit configured to store address information of the memory cell array in which the initial data is stored.

4. The flash memory device of claim 1, wherein the memory cell array has an initial data storing circuit for storing the initial data in accordance with an address set by the controller.

5. The flash memory device of claim 3, wherein the initial data storing circuit includes:
    a first data unit configured to store the initial data to be stored in the initial data latching circuit; and
    a second data unit configured to store data having a logic level that is the opposite of the data stored in the first data unit.

6. The flash memory device of claim 5, wherein the data evaluating circuit includes:
    a control signal outputting unit configured to compare the data of the first data unit with the data of the second data unit and output a control signal in accordance with the comparing result; and
    a data transmitting circuit configured to transmit the data in the first data unit to the initial data latching circuit in accordance with the outputted control signal.

7. The flash memory device of claim 6, wherein the control signal outputting unit is a logic combination device for performing logic combination of the data of the first data unit and the data of the second data unit and outputting result of the logic combination.

8. The flash memory device of claim 6, wherein the control signal outputting circuit outputs the control signal for controlling the data transmitting circuit so that first data are transmitted to the initial data latching circuit if the data of the second data unit has a logic level that is inverse to that of the data of the first data unit.

9. The flash memory device of claim 4, wherein the initial data storing circuit includes:
    a first data unit configured to store the initial data stored in the initial data latching circuit; and
    a second data unit configured to store error verifying data for controlling an error of the initial data stored in the first data unit.

10. The flash memory device of claim 9,
    wherein a logic level of the error verifying data if the number of '1' in the first data unit is an even number is different from that of the error verifying data if the number of '1' in the first data unit is an odd number.

* * * * *